United States Patent
Kim

(10) Patent No.: US 9,986,645 B2
(45) Date of Patent: May 29, 2018

(54) TRANSPARENT CONDUCTIVE POLYMER ELECTRODE FORMED BY INKJET PRINTING, DISPLAY DEVICE INCLUDING THE ELECTRODE, AND METHOD OF MANUFACTURING THE ELECTRODE

(71) Applicant: LG CHEM, LTD., Seoul (KR)

(72) Inventor: Joon-Hyung Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 658 days.

(21) Appl. No.: 14/024,264

(22) Filed: Sep. 11, 2013

(65) Prior Publication Data

US 2014/0078416 A1 Mar. 20, 2014

Related U.S. Application Data

(63) Continuation of application No. PCT/KR2013/003971, filed on May 7, 2013.

(30) Foreign Application Priority Data

May 7, 2012 (KR) .......................... 10-2012-0048217

(51) Int. Cl.
*H05K 3/12* (2006.01)
*G06F 3/044* (2006.01)
(Continued)

(52) U.S. Cl.
CPC ............. *H05K 3/125* (2013.01); *G06F 3/044* (2013.01); *H05K 1/0274* (2013.01); *H05K 1/095* (2013.01);
(Continued)

(58) Field of Classification Search
CPC ...... H05K 3/125; H05K 1/0274; H05K 1/095; G06F 3/044; G06F 2203/04103;
(Continued)

(56) References Cited

U.S. PATENT DOCUMENTS

2004/0131782 A1* 7/2004 Hasei ..................... H05K 3/125
427/337
2008/0175981 A1 7/2008 Suzuki
(Continued)

FOREIGN PATENT DOCUMENTS

CN 1815686 8/2006
JP 2009-295936 A 12/2009
(Continued)

OTHER PUBLICATIONS

Mustonen et al., Inkjet printing of transparent and conductive patterns, 2007, Physica Status Solidi (b), 244 No. 11, 4336-4340.*

*Primary Examiner* — Eli D Strah
(74) *Attorney, Agent, or Firm* — Dentons US LLP

(57) ABSTRACT

The present invention relates to a transparent conductive polymer electrode including a plurality of electrode lines formed of droplets of conductive polymer, each of the electrode lines including first and second regions having different conductive polymer droplet hit densities. The first region has a ratio of b/a within a range of 0.2 to 0.8, where "a" is a distance from a center to an edge of the electrode line in at least one direction of width and length directions thereof, and "b" is a distance from the center to an edge of the first region in the at least one direction. The second region is the remaining region of the electrode line, and the conductive polymer droplet hit density of the second region is lower than that of the first region.

8 Claims, 7 Drawing Sheets

(51) Int. Cl.
  *H05K 1/02* (2006.01)
  *H05K 1/09* (2006.01)
  *H01L 51/00* (2006.01)

(52) U.S. Cl.
  CPC ..... *B32B 2457/20* (2013.01); *B32B 2457/208* (2013.01); *G02F 2201/12* (2013.01); *G06F 2203/04103* (2013.01); *H01L 51/0037* (2013.01); *Y10T 428/1036* (2015.01)

(58) Field of Classification Search
  CPC ............ G02F 2201/12; H01L 51/0037; Y10T 428/1036; B32B 2457/20; B32B 2457/208
  See application file for complete search history.

(56) References Cited

U.S. PATENT DOCUMENTS

2008/0187651 A1* 8/2008 Lee .................... C09D 11/52
                                                   427/77
2010/0225868 A1* 9/2010 West ................ G02F 1/133305
                                                   349/139
2011/0059232 A1    3/2011 Lee et al.
2011/0187798 A1    8/2011 Rogers et al.
2011/0310053 A1* 12/2011 Kim ..................... C08L 65/00
                                                   345/174
2013/0168138 A1    7/2013 Yamazaki et al.

FOREIGN PATENT DOCUMENTS

| JP | 2011230431      | 11/2011 |
| JP | 201279169    A  | 4/2012  |
| JP | 201288956    A  | 5/2012  |
| KR | 10-2008-0068567 A | 7/2008 |
| KR | 10-0865871   B1 | 10/2008 |
| KR | 10-2011-0026381 A | 3/2011 |
| KR | 10-2012-0041394 A | 5/2012 |
| TW | 201303905    A1 | 1/2013  |
| WO | 2012005205   A1 | 1/2012  |

* cited by examiner

US 9,986,645 B2

TRANSPARENT CONDUCTIVE POLYMER ELECTRODE FORMED BY INKJET PRINTING, DISPLAY DEVICE INCLUDING THE ELECTRODE, AND METHOD OF MANUFACTURING THE ELECTRODE

CROSS-REFERENCE TO RELATED APPLICATIONS

This application is a Continuation Bypass Application of International Patent Application No. PCT/KR2013/003971, filed May 7, 2013, and claims the benefit of Korean Patent Application No. 10-2012-0048217 filed on May 7, 2012, in the Korean Intellectual Property Office, the disclosure of which are incorporated herein by reference.

TECHNICAL FIELD

The present invention relates to a transparent conductive polymer electrode formed by inkjet printing, a display device including the electrode, and a method of manufacturing the electrode. More particularly, the present invention relates to a transparent conductive polymer electrode formed by inkjet printing in a manner such that the hit density of conductive polymer droplets ejected onto an electrode line of the electrode is decreased from a first region to a second region of the electrode line such that it may be difficult to visually perceive the electrode line; a display device including the electrode; and a method of manufacturing the electrode.

BACKGROUND

Transparent electrodes are used for various devices in a variety of fields. For example, transparent electrodes are used for flat panel displays such as thin film transistor-liquid crystal displays (TFT-LCDs), plasma display panels (PDPs), and organic light emitting diode (OLED) displays; touch panels; electromagnetic shield films; antistatic films; heat reflection films; flat heating elements; and photoelectric transducers.

Transparent electrodes are usually formed of indium tin oxide (ITO). However, if transparent electrodes formed of ITO are used in flexible devices, the transparent electrodes may easily be fractured in the case that stress is applied thereto, due to, for example, strain or bending. Furthermore, since the indium component of ITO is relatively expensive and stocks thereof are being exhausted, it is necessary to find an alternative material.

As a result, techniques for forming transparent electrodes using conductive polymers are gaining attention. Since conductive polymers can be used in various fields such as fuel cells, displays, actuators, antistatic conductive coatings, and electromagnetic shield conductive coatings, a great deal of research has been conducted into conductive polymers. Particularly, a large amount of academic and industrial research has been conducted into conductive polymer patterning techniques for forming thin film transistors or wiring electrodes in flexible displays, considered to be next generation displays.

As a conductive polymer patterning technique, a high-speed solution process for printing on a flexible support using an inkjet printer has recently been developed. FIG. 1 illustrates a conductive polymer patterning technique of the related art using an inkjet printer. According to the conductive polymer patterning technique of the related art illustrated in FIG. 1, droplets are uniformly ejected onto the entire region of a pattern. Such a solution process using an inkjet printer is advantageous in that a desired pattern can be rapidly formed without generating waste and having to use an optical mask. However, a pattern formed by such a solution process of the related art may easily be seen due to the light transmittance difference between a conductive polymer pattern region and the remaining region, to lower the visual quality of a display or a touch sensor.

To address this limitation, the thickness of a conductive polymer pattern may be reduced to lower the light transmittance difference. However, in this case, the electrical conductivity of the conductive polymer pattern is also lowered in proportion to the thickness of the conductive polymer pattern.

SUMMARY

Aspects of the present invention provide: a transparent conductive polymer electrode which is relatively inexpensive, easy to manufacture, satisfactory in terms of electrical conductivity, and difficult to visually perceive; a display device including the transparent conductive polymer electrode; and a method of manufacturing the transparent conductive polymer electrode.

According to an aspect of the present invention, there is provided a transparent conductive polymer electrode including a plurality of electrode lines formed of droplets of conductive polymer, each of the electrode lines including first and second regions having different conductive polymer droplet hit densities, wherein: the first region has a ratio of b/a within a range of 0.2 to 0.8, where "a" is a distance from a center to an edge of the electrode line in at least one direction of width and length directions thereof, and "b" is a distance from the center to an edge of the first region in the at least one direction; the second region is the remaining region of the electrode line; and the conductive polymer droplet hit density of the second region is lower than that of the first region.

According to another aspect of the present invention, there is provided a display device including the transparent conductive polymer electrode.

According to another aspect of the present invention, there is provided a method of manufacturing a transparent conductive polymer electrode, the method including forming a conductive pattern as an electrode line by inkjet printing, the electrode line including first and second regions having different hit densities of conductive polymer droplets, wherein: the first region has a ratio of b/a within a range of 0.2 to 0.8, where "a" is a distance from a center to an edge of the electrode line in at least one direction of width and length directions thereof, and "b" is a distance from the center to an edge of the first region in the at least one direction; the second region is the remaining region of the electrode line; and the hit density of the conductive polymer droplets in the second region is lower than the hit density of the conductive polymer droplets in the first region.

According to the aspects of the invention, the transparent conductive polymer electrode is inexpensive, easy to manufacture, satisfactory in terms of electrical conductivity, and difficult to visually perceive, and a display device including the transparent conductive polymer electrode can be provided.

In addition, according to the method of manufacturing the transparent conductive polymer electrode by inkjet printing, the hit density of the conductive polymer droplets can be decreased from the first region to the second region of the electrode line (electrode pattern).

DETAILED DESCRIPTION OF THE EMBODIMENTS

Figure 1:
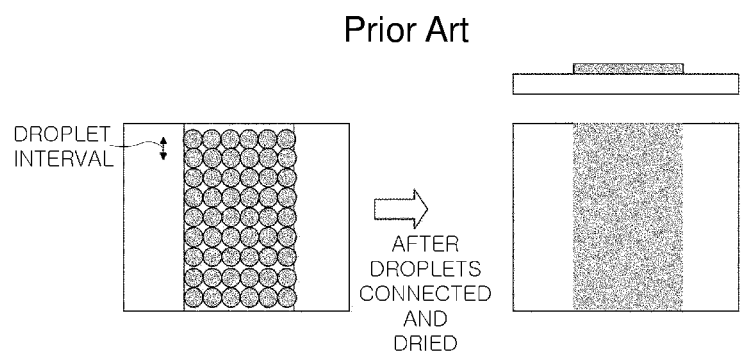
FIG. 1 is a view for explaining a conductive polymer patterning method using an inkjet printing method in the related art.
Figure 2:
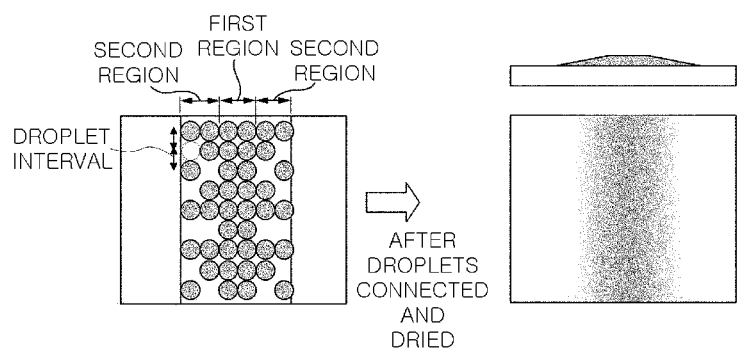
FIG. 2 is a view for explaining a method of forming a conductive polymer electrode according to an embodiment of the invention.

Hereinafter, embodiments of the present invention will be described in detail with reference to the accompanying drawings. The drawings are attached hereto to help explain exemplary embodiments of the present invention, and the present invention is not limited to the drawings and embodiments. In the drawings, the sizes or lengths of elements may be exaggerated, reduced, or omitted for clarity or conciseness.

The inventors of the present invention have conducted much research into developing a transparent conductive polymer electrode having a certain degree of electrical conductivity and difficult to visually perceive, and as a result, transparent conductive polymer electrodes are proposed as described in the embodiments of the invention.

An aspect of the present invention provides a transparent conductive polymer electrode including a plurality of electrode lines formed of conductive polymer droplets, wherein the hit density of the conductive polymer droplets ejected to form each electrode line is decreased from a first region to a second region of the electrode line. The first region has a ratio of b/a within the range of 0.2 to 0.8, where "a" is a distance from a center to an edge of the electrode line in at least one direction of width and length directions thereof, and "b" is a distance from the center to an edge of the first region in the at least one direction. The second region is the remaining region of the electrode line. The hit density of conductive polymer droplets is calculated as the number of conductive polymer droplets attached per unit area.

That is, according to embodiments of the invention, the transparent conductive polymer electrode includes a plurality of electrode lines formed of conductive polymer droplets, and the hit density of the conductive polymer droplets in each electrode line is decreased from the first region to the second region of the electrode line.

Referring to FIGS. 2 to 8 in which embodiments of the invention are illustrated, transparent conductive polymer electrodes include first regions and second regions, and the hit density of conductive polymer droplets is decreased from the first regions to the second regions, and as a result the distribution of the thickness of the electrode lines may be adjusted.

In general, the thickness of each of the electrode lines of the transparent conductive polymer electrode is proportional to the number of conductive polymer droplets per unit area. Therefore, the thickness of the electrode line may be adjusted in proportion to the volume of conductive polymer droplets ejected per square millimeter ($mm^2$) of a substrate. For example, if the thickness of a transparent conductive polymer electrode formed by ejecting one hundred uniform droplets per square millimeter ($mm^2$) and drying the droplets is about 54 nm, a transparent conductive polymer electrode having a thickness of about 27 nm may be formed by ejecting fifty uniform droplets per square millimeter ($mm^2$) and drying the droplets.

In the embodiments of the invention, as described above, the first region of the electrode line has a ratio of b/a within the range of 0.2 to 0.8, where "a" is a distance from a center to an edge of the electrode line, and "b" is a distance from the center to an edge of the first region. The second region is the remaining region of the electrode line. The hit density of conductive polymer droplets is calculated as the number of conductive polymer droplets attached per unit area.

As described above, in the embodiments of the invention, the hit density of the conductive polymer droplets decreases from the first region to an edge of the second region of the electrode line of the transparent conductive polymer electrode. The hit density of the conductive polymer droplets in the outermost edges of the second region may be about 3% to 60% or about 5% to 30% of the hit density of the conductive polymer droplets in the first region. In this case, the electrode line may not be seen.

In the embodiments of the invention, the height (thickness) of the first region of the electrode line of the transparent conductive polymer electrode may be adjusted according to ink compositions. For example, if the electrode line of the transparent conductive polymer electrode is formed of ink including: about 1 wt % of poly(3,4-ethylenedioxythiophene) poly(styrenesulfonate) (PEDOT:PSS) which is slightly blue; and an additional polymer material which is transparent in visible light, the height of the electrode line may be increased according to the concentration of the additional polymer material. Even in this case, a desired visual effect may be obtained by appropriately varying the ratio of the thicknesses of the first and second regions of the electrode line.

On the other hand, if the electrode line of the transparent conductive polymer electrode is formed of ink not including any additional transparent polymer material, the first region of the electrode line may have a height in the range of 50 nm to 300 nm or 100 nm to 200 nm. In this case, the electrical conductivity of the first region may be high, and a blue line by PEDOT:PSS may not be seen in the electrode line to provide good visual quality.

In the transparent conductive polymer electrode of the embodiments of the invention, the pitch of the electrode lines may be in proportion to the nozzle diameter of an inkjet head and may be varied according to the energy characteristics of a surface on which ink droplets fall. For example, the pitch of the electrode lines may be from 5 μm to 200 μm or from 50 μm to 120 μm. In this case, the electrode lines of the transparent conductive polymer electrode may easily be formed, and the thickness of the transparent conductive polymer electrode may easily be adjusted without the problem of ink droplet overlaps.

In the embodiments of the invention, the electrical conductivity of the transparent conductive polymer electrode may be equal to or less than 500 Ω/m or equal to or less than 150 Ω/cm. Since a lower level of resistance is advantageous, the lower limit of the electric resistance of the transparent conductive polymer electrode may be 0 Ω/m. The electrical conductivity of the transparent conductive polymer electrode may be calculated from a DC resistance value measured between both lengthwise ends of the transparent conductive polymer electrode using a tester. If the transparent conductive polymer electrode has a resistance of greater than 500 Ω/cm, it may be difficult to use the transparent conductive polymer electrode in a touch sensor because of a required level of resistance between both ends of the touch sensor.

The light transmittance of the transparent conductive polymer electrode may be within the range of 80% to 95%, 85% to 95%, or 90% to 95%. In this case, the transparent conductive polymer electrode may provide good visibility.

In the embodiments of the invention, the transparent conductive polymer electrode, that is, the electrode lines of the transparent conductive polymer electrode may be formed of a conductive polymer selected from the group consisting of polyacetylene, polypyrrole, polyaniline, poly(p-phenylene vinylene), and poly(thiophene) poly(3,4-ethylenedioxythiophene). However, the present invention is not limited thereto.

Particularly, the conductive copolymer may include PEDOT:PSS (poly(3,4-ethylenedioxythiophene) poly(styrenesulfonate)) having the following formula 1.

[Formula 1]

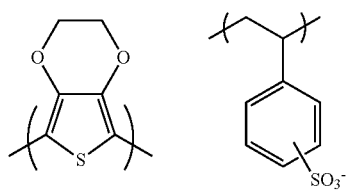

In the embodiments of the invention, transparent conductive ink containing the PEDOT:PSS may be used to form the transparent conductive polymer electrode. For example, a commercial product such as Clevios™ P by Heraeus or Organcon™ by Agfa may be used as the transparent conductive ink.

The transparent conductive ink may be diluted with water or a polar organic solvent to have a solid content of 0.5% to 5%. In this case, all components of the transparent conductive ink other than the conductive polymer may be solvents. If the solid content of the transparent conductive ink is within the above-mentioned range, the transparent conductive polymer electrode may easily be formed of the transparent conductive ink.

Another aspect of the present invention provides a display device or an energy generator including the transparent conductive polymer electrode. Examples of the display device include electronic paper, organic light emitting diode displays, LCDs, three dimensional image filters, and touch sensor devices. An example of the energy generator includes organic photovoltaic cells.

Next, a method of manufacturing a transparent conductive polymer electrode will be described according to embodiments of the invention.

Another aspect of the present invention provides a method of manufacturing a transparent conductive polymer electrode, the method including forming a conductive pattern as an electrode line by inkjet printing, wherein the electrode line includes first and second regions having different conductive polymer droplet hit densities. The first region has a ratio of b/a within a range of 0.2 to 0.8, where "a" is a distance from a center to an edge of the electrode line in at least one direction of width and length directions thereof, and "b" is a distance from the center to an edge of the first region in the at least one direction. The second region is the remaining region of the electrode line, and the conductive polymer droplet hit density of the second region is lower than that of the first region.

Figure 3:
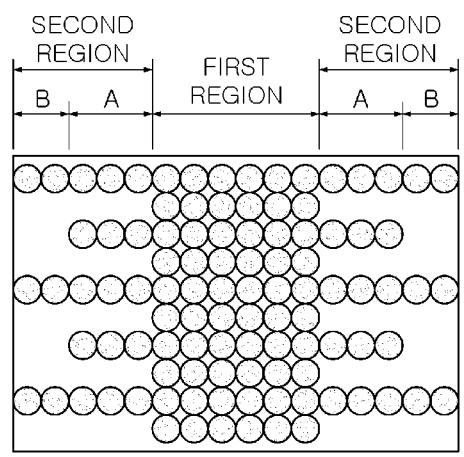
FIG. 3 is a view for explaining a method of forming a conductive polymer electrode according to another embodiment of the invention.
Figure 4:
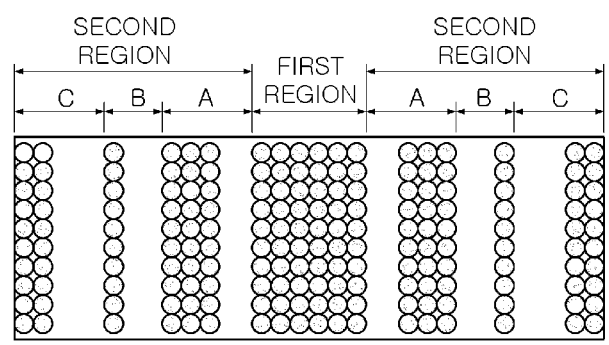
FIG. 4 is a view for explaining a method of forming a conductive polymer electrode according to another embodiment of the invention.
Figure 5:
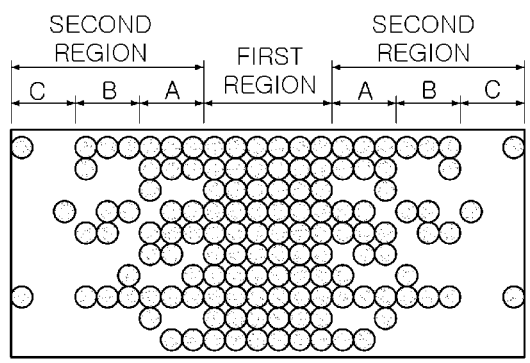
FIG. 5 is a view for explaining a method of forming a conductive polymer electrode according to another embodiment of the invention.

According to embodiments of the invention, the electrode line may be patterned by various methods so that the hit density of the conductive polymer droplets can be decreased from the first region to the second region of the electrode line. Exemplary embodiments thereof are illustrated in FIGS. 3 to 5. Exemplary methods of adjusting the hit density of conductive polymer droplets will now be described with reference to FIGS. 3 to 5. FIGS. 3 to 5 are attached hereto to help explain exemplary embodiments of the invention, and the present invention is not limited thereto.

First, with reference to FIG. 3, a method of manufacturing a transparent conductive polymer pattern will be described according to an embodiment of the invention. For example, as shown in FIG. 3, a transparent conductive polymer pattern may be formed by dividing the width of an electrode line into three regions (a first region in the middle area and second regions in the remaining areas), dividing each of the second regions into two sub regions (i.e., regions A and B), and ejecting conductive polymer droplets into the regions at different intervals. For example, the conductive polymer droplets may be ejected into the first region at intervals of 30 μm×30 μm (width×length), regions A at intervals of 30 μm×60 μm (width×length), and regions B at intervals of 30 μm×120 μm (width×length). Owing to the different intervals in different regions, the thickness of the electrode line may be relatively thick in the center portion thereof, and as it goes to lateral edges of the electrode line, the thickness of the electrode line may be reduced. The terms "width" and "length" are dimensions measured in width and length directions of the electrode line, respectively. In addition, the term "interval" refers to a distance measured between the centers of conductive polymer droplets. In FIG. 3, the diameter of conductive polymer droplets is equal to the interval between the conductive polymer droplets. However, the present invention is not limited thereto. For example, the interval between conductive polymer droplets may be smaller than the diameter of the conductive polymer droplets, and in this case, two conductive polymer droplets may form a relatively large elliptical conductive polymer droplet.

In the embodiment illustrated in FIG. 3, the interval between conductive polymer droplets is varied in the length direction. In other embodiments, the interval of conductive polymer droplets may be varied in both the width and length directions.

FIG. 4 is a view for explaining a method of manufacturing a transparent conductive polymer pattern according to another embodiment of the invention. For example, as shown in FIG. 4, a transparent conductive polymer pattern may be formed by dividing an electrode line into a first region (center region) and second regions (the remaining regions) in the width direction of the electrode line, dividing each of the second regions into three sub regions (i.e., regions A, B, and C), and ejecting conductive polymer droplets into the regions in different manners. That is, conductive polymer droplets are ejected into the entire area of the first region and partial areas of regions A, B, and C.

FIG. 5 is a view for explaining a method of manufacturing a transparent conductive polymer pattern according to another embodiment of the invention. For example, as shown in FIG. 5, a transparent conductive polymer pattern may be formed by dividing an electrode line into a first region (center region) and second regions (the remaining regions) in the width direction of the electrode line, dividing each of the second regions into three sub regions (i.e., regions A, B, and C), and ejecting different numbers of conductive polymer droplets into the regions. For example, if the amount of conductive polymer droplets in the first region is referred to as 100%, the amounts of conductive polymer droplets in regions A, B, and C may be 70%, 40%, and 10%, respectively. That is, in this case, empty areas in which no conductive polymer droplet is disposed are increased in directions toward both sides of the electrode line. That is, the thickness of the electrode line may be reduced in the directions.

In the embodiments illustrated in FIGS. 3 to 5, each of the second regions is divided into two or three sub regions. However, the present invention is not limited thereto. For example, the second regions may be not be divided or may be divided into four or more sub regions.

In the above-described method, a transparent conductive polymer electrode is formed using the same conductive polymer as that described in the description of the transparent conductive polymer electrode, and thus a detailed description thereof will not be repeated.

Figure 6:
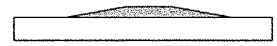
FIG. 6 is a view illustrating a conductive polymer electrode according to an embodiment of the invention.
Figure 6:
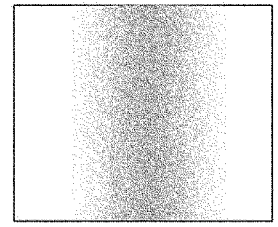
Figure 7:
FIG. 7 is a view illustrating a conductive polymer electrode according to another embodiment of the invention.
Figure 7:
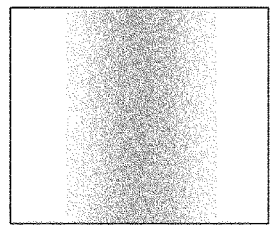
Figure 8:
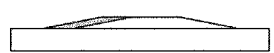
FIG. 8 is a view illustrating a conductive polymer electrode according to another embodiment of the invention.
Figure 8:
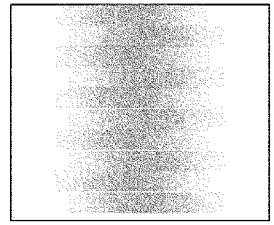

In the method of manufacturing a transparent conductive polymer electrode, electrode lines of the transparent conductive polymer electrode may be patterned to have various cross-sectional shapes. For example, an electrode line having a trapezoidal or curved cross-section may be formed as shown in FIG. 6 or 7. In addition, an electrode line may have non-linear boundaries as shown in FIG. 8. However, the present invention is not limited thereto.

Example 1

(1) Formation of Electrode Lines on Glass Substrate

A glass substrate on which metal lines having a width of about 10 µm were formed at intervals of about 500 µm in the shape of a mesh was prepared. The thickness and diagonal length of the glass substrate were 0.5 mm and about 10 inches. Rectangular electrode patterns (electrode lines) each having a width of about 0.97 mm and a length of about 3 mm were printed on the glass substrate using an inkjet printer. The number of rectangular electrode patterns was thirty seven in the width direction of the glass substrate and twenty two in the length direction of the glass substrate. In this way, electrode lines of a touch sensor were formed (please refer to FIG. 9).

Clevious PH-1000 grade PEDOT:PSS by Heraeus, Germany was diluted with a solvent mixture prepared by mixing water and propylene glycol at a ratio of 7:3 so as to obtain a transparent conductive ink having a solid content of 5%, and 0.05 wt % of a fluorine surfactant was added to the transparent conductive ink. The transparent conductive ink prepared in this way was filled in the inkjet printer to form the electrode patterns as described above.

(2) Patterning Electrode Lines

Figure 9:
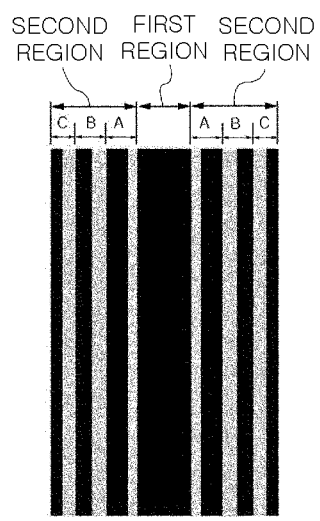
FIG. 9 is a view illustrating an electrode line pattern of a conductive polymer electrode in Example 1.

As shown in FIG. 9, each of the rectangular electrode patterns (electrode lines) having a width of about 0.97 mm and a length of about 3 mm was divided into a first region (300-µm wide central region) and second regions (the remaining regions) in the widthdirection thereof, and each of the second regions was divided into three regions (regions A, B, and C). Then, droplets of the transparent conductive ink were ejected into the entire area of each of the first regions at intervals of 30 µm×30 µm (width×length).

Next, droplets of the transparent conductive ink were partially ejected into each of regions A, B, and C. In detail, transparent conductive ink droplets were not ejected into 25-µm wide areas of regions A adjacent to the first region but were ejected into the remaining 120-µm wide areas of regions A at intervals of 30 µm×30 µm (width×length). Transparent conductive ink droplets were not ejected into 50-µm wide areas of regions B adjacent to regions A but were ejected into the remaining 60-µm wide areas of regions B at intervals of 30 µm×30 µm (width×length). Transparent conductive ink droplets were not ejected into 50-µm wide areas of regions C adjacent to regions B but were ejected into the remaining 30-µm wide areas of regions C at intervals of 30 µm×30 µm (width×length). In this way, electrode lines were formed.

That is, in each of the electrode lines, three empty strips onto which transparent conductive ink droplets were not ejected were present in each of the second regions located at left and right sides of the first region. Thereafter, the electrode lines (electrode patterns) were dried at 120° C. for 20 minutes by using a heating plate.

At this time, the inkjet printer was DMP2800 by Dimatix, USA, and an inkjet head of the inkjet printer had sixteen nozzles, each capable of ejecting 10-picoliter (pl) droplets.

Example 2

Figure 10:
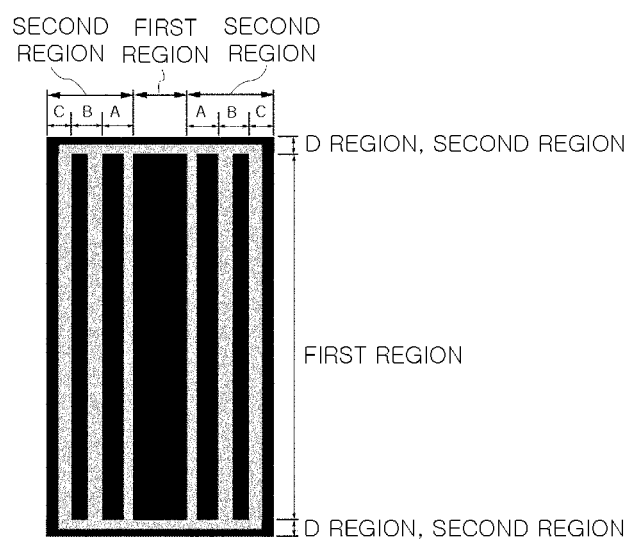
FIG. 10 is a view illustrating an electrode line pattern of a conductive polymer electrode in Example 2.

Electrode lines were formed in the same manner as in Example 1 except that each of rectangular electrode patterns (electrode lines) having a width of about 0.97 mm and a length of about 3 mm was divided into first and second regions in the width and length directions of the electrode line. In detail, as shown in FIG. 10, each electrode line was further divided into a first region (2.76-mm long central region) and second regions (regions D) in the length direction of the electrode line.

A 0.91-mm wide and 60-µm long area of each of regions D adjacent to the first region was left empty without ejecting ink droplets thereinto, and the remaining area of each of regions D was covered with ink droplets at intervals of 30 µm×30 µm (width×length).

As a result, in each electrode line, three empty strips onto which ink droplets were not ejected were present in the second region at each of the left and right sides of the first region, and an empty strip onto which ink droplets were not ejected was present in the second region at each of the upper and lower sides of the first region. Thereafter, the electrode lines were dried at 120° C. for 20 minutes using a heating plate.

Example 3

Figure 11:
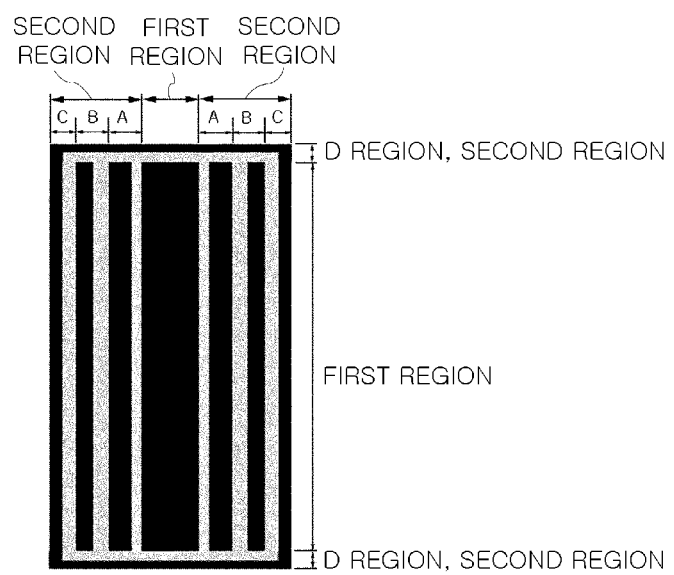
FIG. 11 is a view illustrating an electrode line pattern of a conductive polymer electrode in Example 3.
Figure 11:
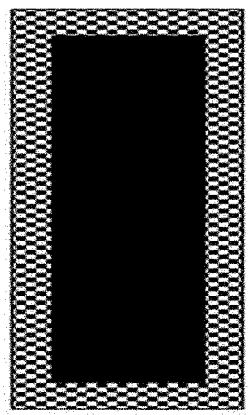

Each of rectangular electrode patterns (electrode lines) having a width of about 0.97 mm and a length of about 3 mm was divided into three parts in the width and length directions as shown in FIG. 11, and a 300-μm wide and 2.4-mm long central region of the rectangular electrode pattern was set as a first region, and the remaining region was set as a second region.

Ink droplets were ejected into the first region in the same manner as in Example 1, and ink droplets were ejected into the second region to form a checked pattern. In detail, ink droplets ejected onto odd and even columns of the second region at intervals of 60 μm were staggered to form a check pattern. As a result, the electrode lines had edge regions on which ink was partially applied in the form of a check pattern. Thereafter, the electrode lines were dried at 120° C. for 20 minutes by using a heating plate.

Comparative Example 1

Figure 12:
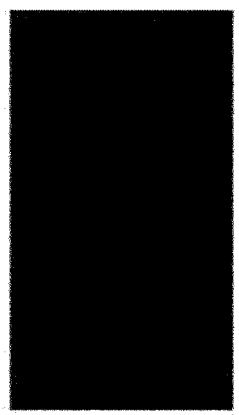
FIG. 12 is a view illustrating an electrode line pattern of a conductive polymer electrode in Comparative Example 1.

Electrode lines were formed in the same manner as in Example 1 except that ink droplets were ejected into the entire areas of first and second regions of the electrode lines at intervals of 30 μm×30 μm (width×length) as shown in FIG. 12.

Comparative Example 2

Electrode lines were formed in the same manner as in Example 1 except that ink droplets were ejected into the entire areas of first and second regions of the electrode lines at intervals of 50 μm×50 μm (width×length).

The hit density of ink droplets on the electrode lines of Comparative Example 2 was 36% of the hit density of ink droplets on the electrode lines of Comparative Example 1.

Experimental Example

Pattern Conductivity Measurement

After drying the ink formed on the electrode patterns (electrode lines), the conductivity of the electrode patterns was evaluated by measuring the DC resistance between both lengthwise ends of the electrode patterns by using a tester. In consideration of the required level of resistance at both ends of a touch sensor, if the measured level of DC resistance was lower than 500 Ω/cm, the conductivity of an electrode pattern was evaluated as good (O), and if the measured level of DC resistance was higher than 500 Ω/cm, the conductivity of an electrode pattern was evaluated as poor (X).

Visibility Measurement

Since visibility is a property evaluated by the naked eye, it is difficult to quantitatively evaluate visibility using a meter. Therefore, each of the glass substrates on which electrode patterns (electrode lines) were formed was placed on a backlight unit capable of uniformly emitting light over a large area, and the visibility of light through the electrode patterns were observed and evaluated into three grads: very good, good, and poor. In detail, if it was difficult to visually perceive the second region of an electrode pattern, the visibility of light through the electrode pattern was evaluated as very good. If an electrode pattern was not a considerable visual obstacle in normal conditions even though the electrode pattern could be visually perceived through careful observation, the visibility of light through the electrode pattern was evaluated as good. If an electrode pattern was clearly seen and it was inconvenient to see through the electrode pattern in normal conditions, the visibility of light through the electrode pattern was evaluated as poor.

Results of measurement or evaluation of conductivity and visibility are shown in Table 1 below.

TABLE 1

|  | Conductivity | Visibility | Note |
|---|---|---|---|
| Example 1 | O | Good |  |
| Example 2 | O | Very good |  |
| Example 3 | O | Very good |  |
| Comparative Example 1 | O | Poor |  |
| Comparative Example 2 | X | Good | Short circuits on some patterns |

While the present invention has been shown and described in connection with the exemplary embodiments, it will be apparent to those skilled in the art that modifications and variations can be made without departing from the spirit and scope of the invention as defined by the appended claims.

What is claimed is:

1. A transparent conductive polymer electrode, comprising a plurality of electrode lines formed of droplets of conductive polymer, created by inkjet printing of an ink composition comprising a conductive polymer comprising PEDOT:PSS (poly(3,4-ethylenedioxythiophene) poly(styrenesulfonate)); and an additional polymer material comprising polyacetylene, poly(p-phenylene vinylene), or poly(thiophene) poly(3,4-ethylenedioxythiophene);

wherein:

each of the electrode lines comprises a central first region, and second regions having different conductive polymer droplet hit densities from the central first region on each side of the central first region, the central first region has a ratio of b/a within a range of 0.2 to 0.8, where "a" is a distance from a center to an edge of an electrode line in at least one direction of width and length directions thereof, and "b" is a distance from the center to an edge of the central first region in the at least one direction, the second regions are the remaining regions of the electrode line, and the conductive polymer droplet hit density of each of the second regions is lower than that of the first region, the hit density of the conductive polymer droplets decreases from the central first region to an edge of each of the second regions of the electrode line of the transparent conductive polymer electrode, and the hit density of the conductive polymer droplets in the outermost edges of the second regions is 5% to 30% of the hit density of the conductive polymer droplets in the central first region, and each of the second regions is divided into at least two regions whose conductive polymer droplet hit densities are different from each other and wherein the electrode line has a thickness distribution in which the thickness of the at least two regions of the second regions becomes reduced as it goes to both lateral edges of the electrode line in the width direction.

2. The transparent conductive polymer electrode of claim 1, wherein the conductive polymer droplet hit density of each of the second regions is 3% to 60% of that of the central first region.

3. The transparent conductive polymer electrode of claim 1, wherein the transparent conductive polymer electrode has a light transmittance of 80% to 95%.

4. A display device comprising the transparent conductive polymer electrode of claim 1.

5. The display device of claim 4, wherein the display device comprises a general display and a touch sensor device.

6. A method of manufacturing a transparent conductive polymer electrode, the method comprising:
 forming on a substrate a conductive pattern comprising a plurality of electrode lines formed of droplets of conductive polymer by inkjet printing an ink composition comprising:
  a conductive polymer comprising PEDOT:PSS (poly (3,4-ethylenedioxythiophene) poly(styrenesulfonate)); and
  an additional polymer material comprising polyacetylene, poly(p-phenylene vinylene), or poly(thiophene) poly(3,4-ethylenedioxythiophene);
 wherein:
 each of the electrode lines comprises a central first region and second regions having different hit densities of conductive polymer droplets from the central first region on each side of the central first region,
 the central first region has a ratio of b/a within a range of 0.2 to 0.8, where "a" is a distance from a center to an edge of an electrode line in at least one direction of width and length directions thereof, and "b" is a distance from the center to an edge of the first region in the at least one direction,
 the second regions are the remaining region of the electrode line,
 the conductive polymer droplet hit density in each of the second regions is lower than the hit density of the conductive polymer droplets in the first region,
 the hit density of the conductive polymer droplets decreases from the central first region to an edge of each of the second regions of the electrode line of the transparent conductive polymer electrode, and the hit density of the conductive polymer droplets in the outermost edges of the second regions is 5% to 30% of the hit density of the conductive polymer droplets in the central first region, and
 each of the second regions is divided into at least two regions whose conductive polymer droplet hit densities are different from each other and wherein the electrode line has a thickness distribution in which the thickness of the at least two regions of the second regions becomes reduced as it goes to both lateral edges of the electrode line in the width direction.

7. The method of claim 6, wherein the hit densities of the conductive polymer droplets are adjusted by partially ejecting conductive polymer droplets onto target points arranged at regular intervals so that some of the target points are left empty without being coated with the conductive polymer droplets.

8. The method of claim 6, wherein the hit density of the conductive polymer droplets in each of the second regions is 3% to 60% of the hit density of the conductive polymer droplets in the first region.

* * * * *